United States Patent
Lo et al.

(10) Patent No.: US 6,306,312 B1
(45) Date of Patent: Oct. 23, 2001

(54) METHOD FOR ETCHING A GOLD METAL LAYER USING A TITANIUM HARDMASK

(75) Inventors: Gladys So-Wan Lo, Fremont; David W. Mytton, Palo Alto; Gregory James Goldspring, Alameda, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/345,974

(22) Filed: Jun. 30, 1999

(51) Int. Cl.$^7$ .......................................................... C23F 1/12
(52) U.S. Cl. .................. 216/67; 216/75; 216/51; 438/689
(58) Field of Search .............................. 438/689; 216/67, 216/75, 51; 252/79.1–79.5

(56) References Cited

U.S. PATENT DOCUMENTS

| | | | |
|---|---|---|---|
| 3,951,709 | * 4/1976 | Jacob ........................................ | 156/8 |
| 4,240,869 | * 12/1980 | Diepers ................................. | 156/643 |
| 4,417,387 | * 11/1983 | Heslop .................................... | 29/591 |
| 5,705,428 | * 1/1998 | Liu et al. .............................. | 437/192 |

FOREIGN PATENT DOCUMENTS

| | | | |
|---|---|---|---|
| 08045918 | * 2/1996 | (JP) ............................ | H01L/21/3065 |

OTHER PUBLICATIONS

C.B. Zarowin, *Theory of Plasma Chemical Transport Etching of Gold in a Chlorine Plasma*, Elsevier Sequoia, Printed in the Netherlands.

Hiroto Ohtake, Seiji Samukawa, Hirokazu Oikawa, Yasunobu Nashimoto, Enhancement of Reactivity in Au Etching by Pulse–Time–Modulated Cl2 Plasma, Japanese Journal of Applied Physics.

* cited by examiner

*Primary Examiner*—Frankie L. Stinson
*Assistant Examiner*—M. Kornakov
(74) *Attorney, Agent, or Firm*—Martine & Penilla, LLP

(57) ABSTRACT

Disclosed is an inventive method for etching a gold metallization in a plasma processing chamber. The method includes introducing a substrate having a gold layer and an overlying titanium hardmask layer into the plasma processing chamber. The hardmask is first etched using conventional etching techniques. Then a plasma is formed in the chamber from an oxidizing gas and an etching gas. The etching gas is preferably a hydrochloric acid containing gas which may contain a chlorine containing gas. In addition, $N_2$ may be provided. The plasma is then used to etch the gold layer through the TiN or TiW hardmask.

12 Claims, 5 Drawing Sheets

METHOD FOR ETCHING A GOLD METAL LAYER USING A TITANIUM HARDMASK

BACKGROUND OF THE INVENTION

The present invention relates generally to semiconductor processing and, more particularly to methods for etching gold layers in an IC layer stack.

In semiconductor IC fabrication, devices such as component transistors are formed on a semiconductor wafer or substrate, which is typically made of silicon. Metallic interconnect lines, which are etched from a metallization layer disposed above the substrate, are then employed to couple the devices together to form a desired circuit. Most commonly, metallization layers are made from aluminum or aluminum alloys, but there is increasing use of other metals such as copper and gold. To facilitate discussion, FIG. 1A illustrates a cross-sectional view of a prior art integrated circuit structure 100, representing the layers formed during the fabrication of a typical semiconductor IC having a gold layer.

A substrate 102 forms a base for an integrated circuit structure 100. A gold layer 104 is shown formed over the surface of the substrate 102. A hardmask layer 106 (typically an oxide layer) is disposed above the gold layer 104, and an overlying photoresist layer 108 is formed over the hardmask layer 106.

The photoresist layer 108 represents a layer of conventional resist material that may be patterned using patterned reticles and a stepper that passes light (e.g., ultra-violet light) onto the surface of the photoresist layer 108. The layers of the integrated circuit structure 100 are readily recognizable to those skilled in the art and may be formed using any number of known deposition processes, including chemical vapor deposition (CVD), plasma-enhanced chemical vapor deposition (PECVD), and physical vapor deposition (PVD) such as sputtering.

To etch the hardmask layer, the photoresist layer 108 is patterned with a suitable photolithography technique, and subsequently the exposed hardmask layer is etched. FIG. 1B shows a cross-sectional view of the prior art integrated circuit structure 100 after etching the oxide hardmask layer 106 to form a hardmask for the underlying gold layer 104.

Conventionally, gold layers have been etched using a $Cl_2$ chemistry at elevated temperatures of about 200° C. At such high temperatures, an oxide hardmask must be employed because of the relatively high etch rate ratio of gold to oxide and the low selectivity to organic photoresist. FIG. 1C shows a cross-sectional view of the prior art integrated circuit structure 100 after etching the gold layer using a $Cl_2$ chemistry at an elevated temperature of about 200° C. The elevated temperature $Cl_2$ etch provides a reasonable etch rate, however, profile control is severely limited and special high temperature reactor configurations must be used.

Due to equipment design and process throughput, a lower temperature etch process is often used to etch metallization layers. However, at lower temperatures a gold etch process using an oxide hardmask is not efficient. Thus, titanium hardmask layers are typically employed to etch metallization layers at lower temperatures of about 70° C. FIG. 2A shows a cross-sectional view of a prior art integrated circuit structure 200, representing the layers formed during the low temperatures fabrication of a typical semiconductor IC having a gold layer, after etching a titanium hardmask layer 206.

The integrated circuit structure 200 includes a substrate 202, a gold layer 204 formed over the surface of the substrate 202, a titanium hardmask layer 206 disposed above the gold layer 204, and an overlying photoresist mask 208 formed over the titanium hardmask layer 206. As discussed above, the titanium hardmask layer 206 is patterned utilizing the photoresist mask 208. However, at low temperatures the Chlorine in a conventional $Cl_2$ chemistry attacks the titanium hardmask at the same time it etches the gold layer, resulting in poor selectivity between the gold layer 204 and the titanium hardmask layer 206. Thus, the titanium hardmask is etched away before the gold layer plasma etch process is finished, resulting in a damaged gold layer 204 after plasma etch, as shown in FIG. 2B.

In view of the forgoing, what is needed are improved methods and apparatuses for etching a gold layer utilizing a titanium hardmask. Further, there is a need for methods and apparatuses that allow etching of a gold layer at conventional or near conventional lower electrode temperatures.

SUMMARY OF THE INVENTION

The present invention fills these needs by providing a gold etching chemistry that can be used at conventional or near conventional electrode temperatures and provides greatly improved mask selectivity with respect to a titanium hardmask. In one embodiment, a method for anisotropically etching a gold layer through an aperture in a hardmask is provided. A substrate is introduced into a processing chamber in preparation for a gold etch. The substrate includes a gold layer, a hardmask layer containing titanium formed above the gold layer, and an overlying photoresist mask disposed above the hardmask layer. The hardmask layer is then etched through the photoresist mask to create a hardmask for the underlying gold layer. Finally, a plasma is created within the processing chamber from an oxidizing gas and an etching gas. The etching gas is preferably a hydrochloric acid containing gas which may contain a chlorine containing gas. In addition, $N_2$ may also be provided. The plasma is then used to etch the gold layer through the hardmask.

In another embodiment, a system for etching gold layers is provided. The gold layer etch system includes a chamber receptive to a substrate having a gold layer and an overlying hardmask containing titanium. Also included in the gold etch system is a gas inlet mechanism connecting an oxidizing gas and an etching gas source to the chamber. The etching gas is preferably a hydrochloric acid containing gas which may contain a chlorine containing gas. In addition, $N_2$ may also be provided. Further included in the system is a pair of electrodes disposed within the chamber, and an RF generator coupled to the electrode pair so that a plasma is formed with the oxidizing gas and the etching gas which etches exposed portions of the gold layer through the hardmask.

In yet a further embodiment of the present invention an integrated circuit having a gold layer formed in a plasma processing chamber is disclosed. In this embodiment, the substrate, from which the integrated circuit is later formed, is introduced into a processing chamber. The substrate includes an underlying gold layer, a hardmask layer containing titanium, and an overlying photoresist mask formed above the hard mask layer. The hardmask layer is then etched through the photoresist mask to create a hardmask. Next, a plasma is created within the processing chamber from an oxidizing gas and an etching gas. The etching gas is preferably a hydrochloric acid containing gas which may contain a chlorine containing gas. $N_2$ may also be provided. The plasma is then used to etch the gold layer through the hardmask. Finally, the substrate is further processed to form an integrated circuit.

Advantageously, the improved titanium hardmask selectivity of the present invention allows the etching of a gold layer at conventional or near conventional lower temperatures, thus avoiding the need for special high temperature reactor configurations. This and other advantages of the present invention will become apparent to those skilled in the art upon a reading of the following description and a study of the various figures of the drawings.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

FIGS. 1A–1C and 2A–2B were described in terms of the prior art. A preferred embodiment of the present invention will now be described with reference to FIGS. 3A–3C. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

Figure 1A:
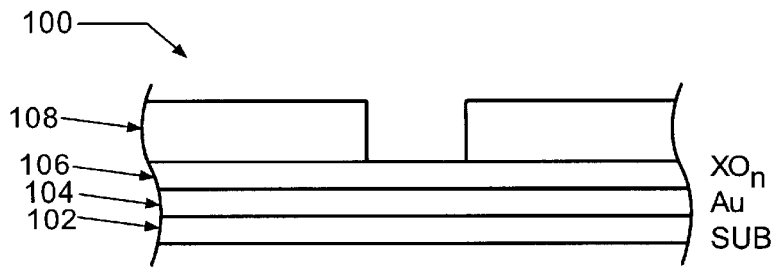
FIG. 1A is an illustration showing a cross-sectional view of a prior art integrated circuit structure including an oxide hardmask layer prior to plasma etch.
Figure 1B:
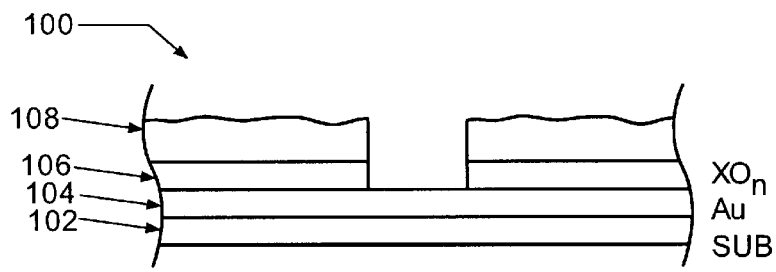
FIG. 1B is an illustration showing a cross-sectional view of the prior art integrated circuit structure after etching the oxide hardmask layer.
Figure 1C:
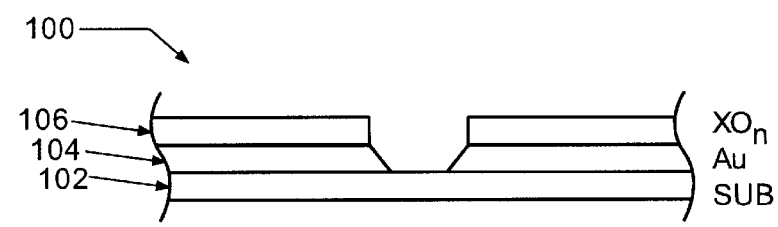
FIG. 1C is an illustration showing a cross-sectional view of the prior art lo integrated circuit structure after etching the gold layer using $Cl_2$ at high plasma temperatures.
Figure 2A:
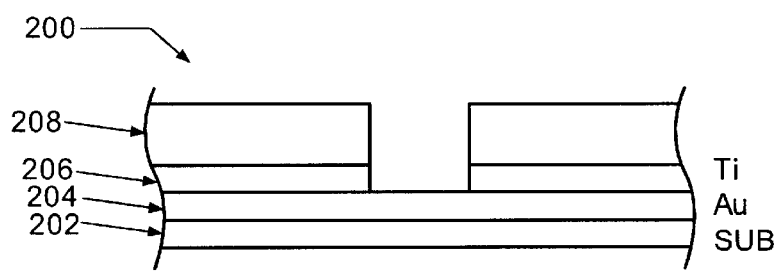
FIG. 2A is an illustration showing a cross-sectional view of a prior art integrated circuit structure including a titanium hardmask layer prior to plasma etch.
Figure 2B:
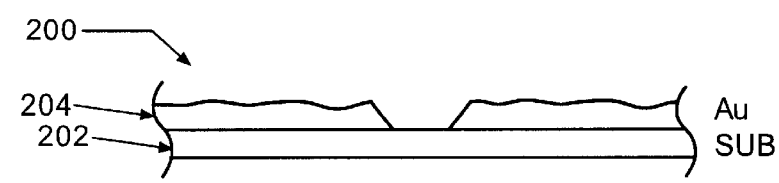
FIG. 2B is an illustration showing a cross-sectional view of the prior art integrated circuit structure layer after etching the gold layer through the titanium hardmask layer using $Cl_2$.
Figure 3A:
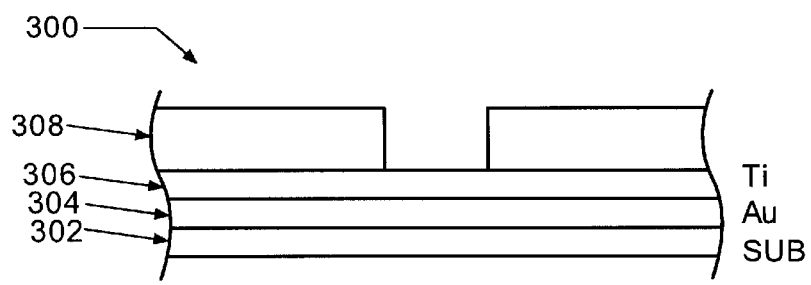
FIG. 3A is an illustration showing a cross-sectional view of an integrated circuit structure prior to plasma etch in accordance with a preferred embodiment of the present invention.

FIG. 3A is an illustration showing a cross-sectional view of an integrated circuit structure 300 prior to plasma etch in accordance with one embodiment of the present invention. At the bottom of the integrated circuit structure 300, there is shown a substrate 302. A gold layer 304 is shown formed over the surface of the substrate 300, and a hardmask layer 306 is disposed above the gold layer 304. The hardmask layer 306 preferably contains a titanium component, such as $TiO_2$, TiW, and TiN. An overlying photoresist layer 308 is then formed over the hardmask layer 306.

As discussed above, the photoresist layer 308 represents a layer of conventional resist material that may be patterned using patterned reticles and a stepper that passes ultra-violet rays, electron beams, or x-rays onto the surface of the photoresist layer 308. The layers of the integrated circuit structure 300 are readily recognizable to those skilled in the art and may be formed using any number of known deposition processes, including chemical vapor deposition (CVD), plasma-enhanced chemical vapor deposition (PECVD), and physical vapor deposition (PVD) such as sputtering.

Figure 3B:
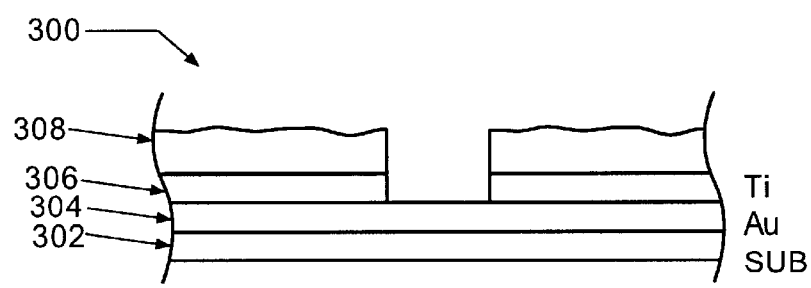
FIG. 3B is an illustration showing a cross-sectional view of the integrated circuit structure after etching the hardmask layer in accordance with a preferred embodiment of the present invention.

To etch the hardmask layer 306, the photoresist layer 308 is patterned with a suitable photolithography technique, and subsequently the exposed hardmask layer is etched. FIG. 3B shows a cross-sectional view of the integrated circuit structure 300 after etching the hardmask layer 306 to form a titanium hardmask for the underlying gold layer 304.

The present invention uses plasma having components derived from an oxidizing gas and an etching gas to etch the gold layer 304 through the titanium hardmask 306. The etching gas utilized in the present invention is preferably a hydrochloric acid containing gas which may contain a chlorine containing gas. In addition, $N_2$ may optionally be added to the plasma, as well as an inert carrier gas. The plasma is used to etch the gold layer at a temperature preferably less than 200° C., and more preferably less than 100° C., and most preferably no greater than about 70° C.

Figure 3C:
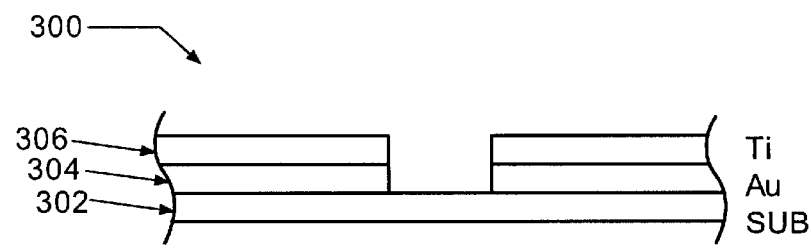
FIG. 3C is an illustration showing a cross-sectional view of the integrated circuit structure after etching the gold layer in accordance with a preferred embodiment of the present invention.

In plasma, the HCL reacts with the titanium hardmask and is believed to form $TiH_2$, a relatively non-volatile hydride. The $TiH_2$ film greatly improves selectivity of Ti to Au. In addition, the chemistry of the present invention can be used at normal electrode operating temperatures of about 70° C. Finally the etching gas derived from HCl will not of its own passivate gold but in the presence of oxidizing passivation agents, such as $O_2$, provides a good etch of gold, as shown in FIG. 3C.

Figure 4:
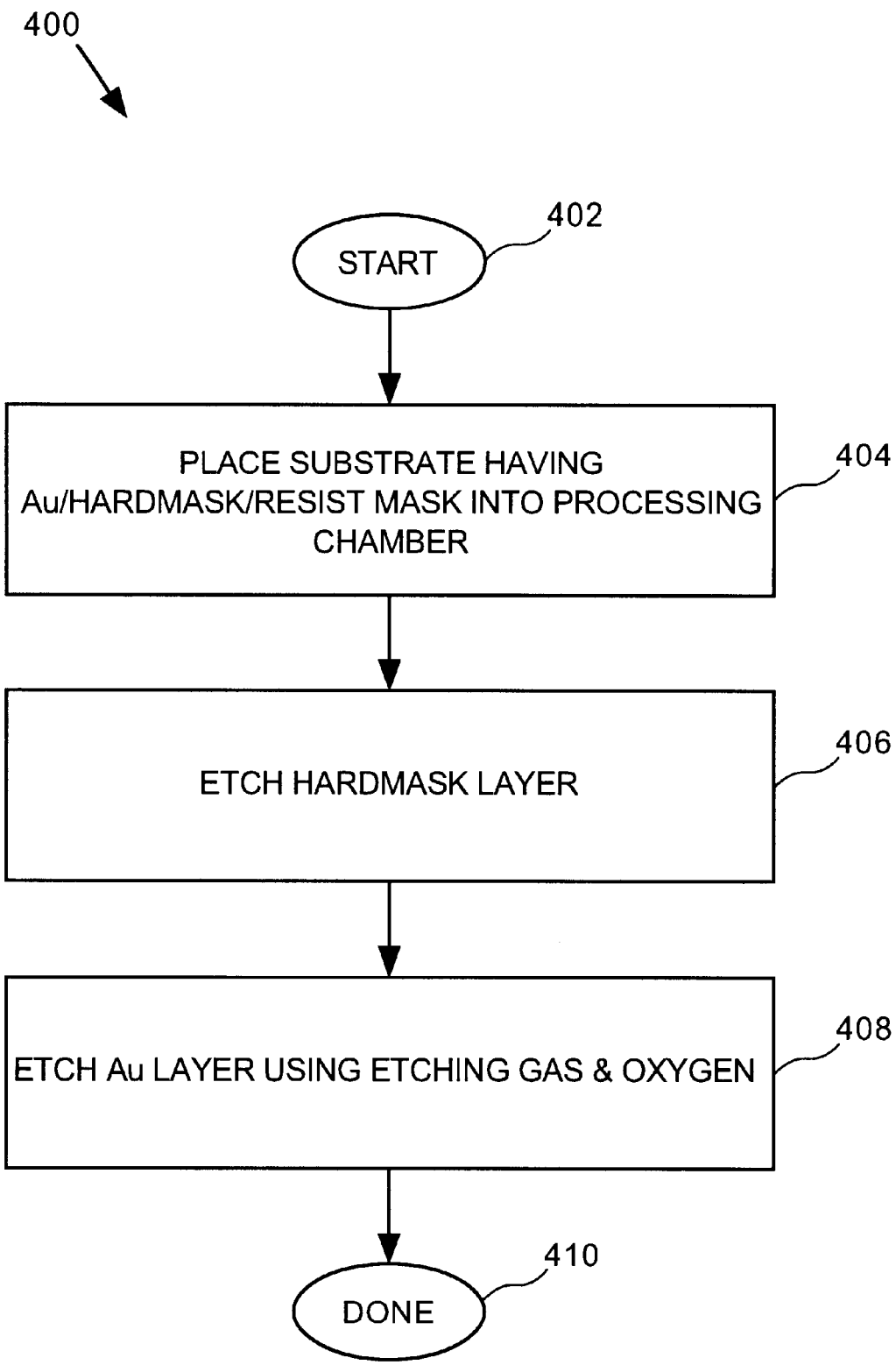
FIG. 4 is a flowchart showing a method for etching a gold layer in accordance with one embodiment of the present invention.

Referring next to FIG. 4, a method 400 for etching a gold layer in accordance with one embodiment of the present invention will now be described. In an initial operation 402, the substrate is prepared for the etching process in a conventional pre-etch operation. The pre-etch operation may include, for example, forming the gold, titanium, and photoresist layers using any number of known deposition processes, including chemical vapor deposition (CVD), plasma-enhanced chemical vapor deposition (PECVD), and physical vapor deposition (PVD) such as sputtering.

In substrate placement operation 404, the substrate having a gold layer, a hardmask containing titanium disposed above the gold layer, and an overlying photoresist layer, is introduced into a plasma processing chamber. The substrate placement operation may also include, clamping the substrate onto a chuck, stabilizing the pressure within the plasma processing chamber, and introducing helium cooling gas to the substrate backside to facilitate heat transfer between the substrate and the chuck.

Next, in operation 406, the hardmask layer is etched. The hardmask layer can be etched with a chlorine-boron containing gas mixture such as $Cl_2/BCl_3/N_2$. As will be apparent to those skilled in the art, chlorine from the chlorine-boron containing gas reacts with the titanium in the titanium containing hardmask layer during the etch process. The actual parameters for etching a titanium layer are well known to those skilled in the art. Having etched the hardmask layer, the substrate is then ready for the gold layer etch.

The method 400 continues with a gold layer etch operation 408. After etching the hardmask layer, a mixture of an oxidizing gas and an etching gas is formed into a plasma to anisotropically etch the gold layer through an aperture in the hardmask. The etching gas is preferably a hydrochloric acid containing gas, such as HCl, but may contain a chlorine containing gas, such as $Cl_2$. In addition, $N_2$ may optionally be added to the plasma, as well as an inert carrier gas. The plasma is used to etch the gold layer at a temperature preferably less than 200° C., and more preferably less than 100° C., and most preferably at about 70° C.

To elaborate further, the HCL reacts with the titanium to form the hardmask and is believed to form $TiH_2$, a relatively non-volatile hybrid, during plasma etch. he $TiH_2$ film greatly improves the selectivity of Ti to Au. In addition, the chemistry of the present invention can be used at normal electrode operating temperatures of about 70° C.

Finally, in operation 410, the substrate undergoes additional post-etch processing operations which are conventional in nature. Thereafter, the finished substrate may be cut into dies, which may then be made into IC chips. The resulting chips may then be incorporated in an electronic device, e.g., any of the well known commercial or consumer electronic devices, including digital computers.

Figure 5:
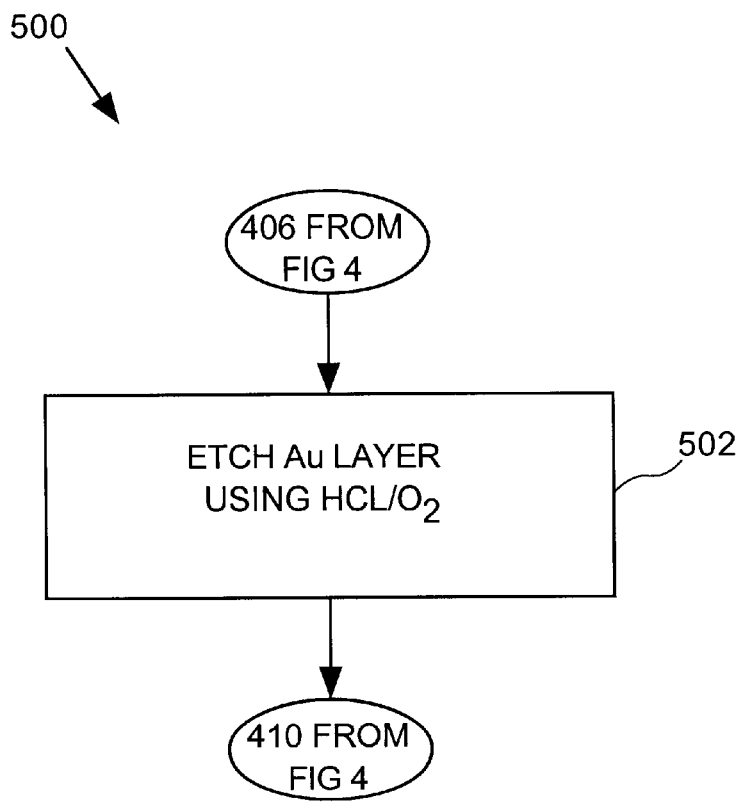
FIG. 5 is a flowchart showing a method for etching a gold layer using an etching gas containing HCl in accordance with another embodiment of the present invention.

FIG. 5 illustrates the process operations 500 associated with etching the gold layer using an etching gas containing hydrochloric acid in accordance with one aspect of the present invention. In operation 502, the gold layer is etched using $HCl/O_2$ and optionally $N_2$. As described above, the HCL reacts with the titanium to form the hardmask and is believed to form a non-volatile $TiH_2$ film during plasma etch. The $TiH_2$ film greatly improves selectivity of Ti to Au, thus allowing for a high degree of profile control during the etch process, since small oxygen additions can be tailored for profile slope control and not for titanium mask etch stop. In addition, the HCl will not of its own passivate gold, but in the presence an oxidizing agent, such as the $O_2$, will form fine lines in the gold layer.

Figure 6:
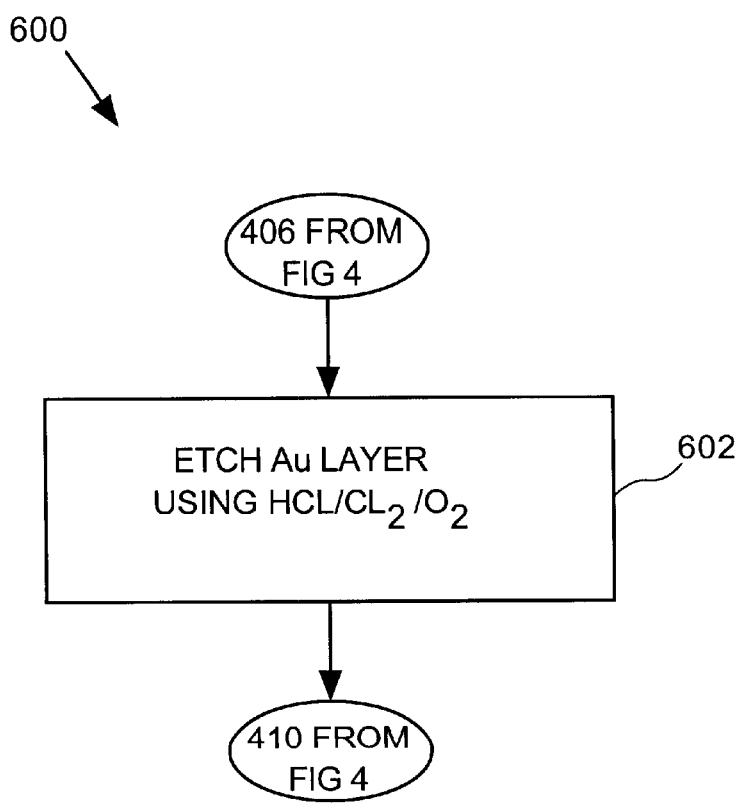
FIG. 6 is a flowchart showing a method for etching a gold layer using an etching gas containing $HCl/Cl_2$ in accordance with yet another embodiment of the present invention.

FIG. 6 illustrates alternative process operations 600 associated with etching the gold layer using an etching gas containing hydrochloric acid and $Cl_2$ in accordance with another aspect of the present invention. In operation 602, the gold layer is etched using $HCL/Cl_2/O_2$ and optionally $N_2$. As mentioned earlier, the HCL reacts with the titanium to form the hardmask and is believed to form a non-volatile $TiH_2$ film which greatly improves selectivity of Ti to Au.

Figure 7:
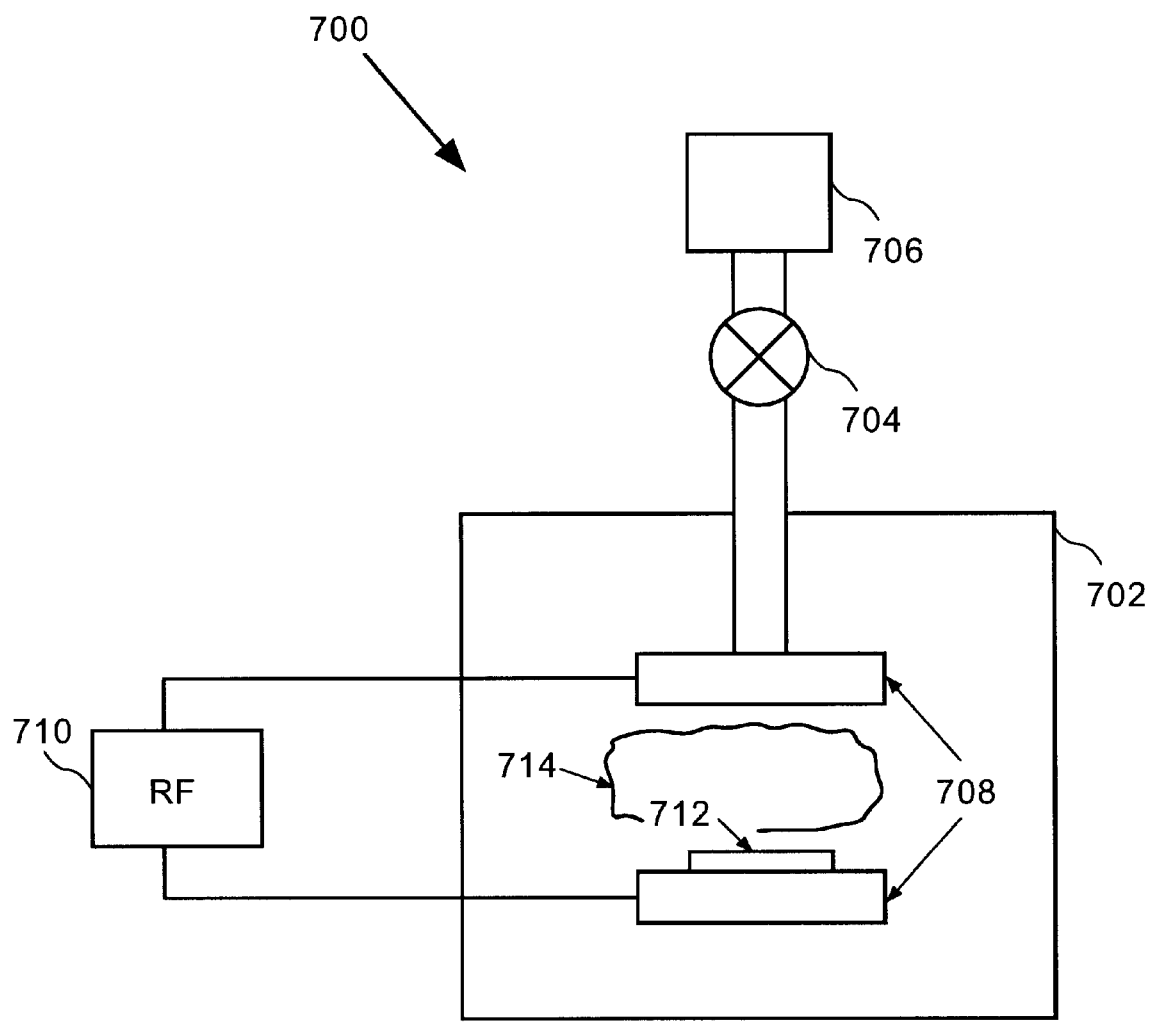
FIG. 7 is an illustration showing a gold layer etching system in accordance with one aspect of the present invention.

Plasma etching systems as described above consist of several components. FIG. 7 is an illustration showing a gold layer etching system 700 in accordance with yet another embodiment of the present invention. The gold layer etching system 700 includes a chamber 702 receptive to substrate 712 provided with a gold layer to be etched and an overlying hardmask having an aperture and containing titanium. Also included in the system 700 is a gas inlet mechanism 704 connecting an oxidizing gas and an etching gas source 706 to the chamber 702, a pair of electrodes 708 disposed within the chamber 702, and an RF generator 710 capacitive coupled to the electrodes 708. In some instances the upper electrode can be omitted by grounding the RF generator 710 to the chamber 702, or by providing inductive coupling to the chamber.

After the substrate 712 is prepared for the gold layer etch, it is placed in the chamber 702. The gas inlet mechanism 704 is then used to release into the chamber 702, the oxidizing gas and the etching gas from the gas source 706. The RF generator 710 is then used to create a plasma 714 containing the oxidizing and etching gases in the chamber 702. The HCL in the plasma reacts with the titanium in the hardmask and is believed to form a non-volatile $TiH_2$ film forming the hardmask which greatly improves the selectivity of Ti to Au, resulting in a high degree of profile control during the etch process as described above. In addition, etching gas derived from HCl will not of its own passivate gold but in the presence of oxidizing passivation agents, such as $O_2$, provides a good etch of gold. p Thereafter, the substrate undergoes additional post-etch processing operations which are conventional in nature, and the finished substrate is then cut into dies, which may then be made into IC chips.

While this invention has been described in terms of several preferred embodiments, there are many alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for anisotropically etching a gold layer through an aperture in a hardmask, comprising:

introducing a substrate into a processing chamber, said substrate including a gold layer, a hardmask layer disposed above said gold layer, wherein said hardmask layer is formed of a compound selected from the group consisting of TiN and TiW, and a patterned photoresist mask disposed above said hardmask layer;

etching said hardmask layer through said photoresist mask, whereby at least one aperture is created in said hardmask layer to create a hardmask; and creating a plasma within said chamber from an oxidizing gas and an etching gas comprising hydrogen chloride, whereby said gold layer is etched through said aperture said hardmask.

2. A method as recited in claim 1, wherein the etching gas further comprises $Cl_2$.

3. A method as recited in claim 1, wherein the plasma further comprises $N_2$.

4. A method as recited in claim 1, wherein the plasma is created at a temperature no greater than about 200° C.

5. A method as recited in claim 1, wherein the plasma is created at a temperature no greater than about 100° C.

6. A method as recited in claim 1, wherein the plasma is created at a temperature no greater than about 70° C.

7. A method for making an integrated circuit structure having a gold layer provided with a via, comprising:

introducing a substrate into a processing chamber, said substrate including a gold layer, a hardmask layer disposed above said gold layer, wherein said hardmask layer is formed of a compound selected from the group consisting of TiN and TiW, and a patterned photoresist mask disposed above said hardmask layer;

etching said hardmask layer through said photoresist mask, whereby at least one aperture is created in said hardmask layer to create a hardmask;

creating a plasma within said chamber from an oxidizing gas and an etching gas comprising hydrogen chloride, whereby said gold layer is etched through said aperture in said hardmask; and processing said substrate though a series of semiconductor processes to form an integrated circuit.

8. A method as recited in claim 7, wherein the etching gas further comprises $Cl_2$.

9. A method as recited in claim 7, wherein the plasma further comprises $N_2$.

10. A method as recited in claim 7, wherein the plasma is created at a temperature no greater than about 200° C.

11. A method as recited in claim 7, wherein the plasma is created at a temperature no greater than about 100° C.

12. A method as recited in claim 7, wherein the plasma is created at a temperature no greater than about 70° C.

* * * * *